(12) United States Patent
Arai

(10) Patent No.: US 8,044,730 B2
(45) Date of Patent: Oct. 25, 2011

(54) SECONDARY VIBRATION DAMPING TYPE CRYSTAL OSCILLATOR CIRCUIT

(75) Inventor: Junichi Arai, Sayama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 107 days.

(21) Appl. No.: 12/462,364

(22) Filed: Aug. 3, 2009

(65) Prior Publication Data

US 2010/0033258 A1    Feb. 11, 2010

(30) Foreign Application Priority Data

Aug. 5, 2008    (JP) ................. 2008-201394

(51) Int. Cl.
*H03B 5/32* (2006.01)
(52) U.S. Cl. .................... 331/116 R; 331/158
(58) Field of Classification Search ............. 331/116 R, 331/116 FE, 158, 160, 117 R, 117 FE
See application file for complete search history.

(56) References Cited

U.S. PATENT DOCUMENTS 4,376,918 A * 3/1983 Masuda et al. ......... 331/116 FE
7,352,256 B2 * 4/2008 Oita .............................. 331/158

FOREIGN PATENT DOCUMENTS

| JP | 4-207608 A | 7/1992 |
|---|---|---|
| JP | 7-263980 A | 10/1995 |
| JP | 09-153740 | 6/1997 |
| JP | 2000-295037 | 10/2000 |
| JP | 2002-280837 A | 9/2002 |
| JP | 2006-345115 | 12/2006 |
| JP | 2007-020158 A | 1/2007 |
| JP | 2007-103985 A | 4/2007 |

* cited by examiner

*Primary Examiner* — Ryan Johnson
(74) *Attorney, Agent, or Firm* — Carrier Blackman & Associates, P.C.; Joseph P. Carrier; William D. Blackman

(57) ABSTRACT

A secondary vibration damping type crystal oscillator circuit is formed as a Colpitts type, in which a crystal unit is connected between base and collector terminals, a first capacitor is connected between emitter and collector terminals, and a second capacitor is connected between emitter and base terminals of a oscillating transistor. A region between the emitter and collector terminals or between the emitter and base terminals includes a reactance parallel circuit, in which an LC series circuit is connected in parallel to the first or second capacitor. The reactance parallel circuit has resonant characteristics that the reactance parallel circuit is made capacitive at an oscillating frequency in principal vibration mode of the crystal unit as an oscillating frequency, and a resonant frequency of the LC series circuit corresponds to the vibrational frequency in secondary vibration mode that is close to the principal vibration mode.

6 Claims, 4 Drawing Sheets

Background Art                    Background Art

Background Art

Background Art

SECONDARY VIBRATION DAMPING TYPE CRYSTAL OSCILLATOR CIRCUIT

This application claims priority from Japanese Patent Application No. 2008-201394 filed on Aug. 5, 2008, the entire subject matter of which is incorporated herein by reference.

BACKGROUND OF THE INVENTION

1. Field of the Invention

The invention relates to a technical field of a secondary vibration damping type crystal oscillator circuit which is formed as a Colpitts type oscillator circuit, and in particular, to a crystal oscillator circuit whose crystal unit is formed as an SC-cut crystal element to damp oscillation at a vibrational frequency in B mode.

2. Description of the Related Art

Crystal oscillator circuits have extremely high frequency stability due to their crystal units, to be adopted as sources of generating frequencies for various communication devices. As one of these, there is, for example, a crystal oscillator circuit using an SC-cut crystal unit excellent in stress sensitivity behavior, and this is particularly applied to, for example, a base station or the like whose frequency deviation is set in 1 ppb (parts per billion unit) to be highly-stabilized.

FIGS. 5A and 5B are diagrams of for explanation of one example of related art crystal oscillator circuits. FIGS. 5A and 5B are both high-frequency type crystal oscillator circuit (equivalent circuit) diagrams from which their power supplies, bias resistances, and the like are eliminated.

The crystal oscillator circuit of FIG. 5A has an oscillating resonant circuit 1 and an oscillating amplifier 2 that feedback-amplifies an oscillating frequency dependent on the oscillating resonant circuit 1. The oscillating resonant circuit 1 is a Colpitts type oscillator circuit in general, and is basically composed of a crystal unit 3 functioning as an inductor component and first and second capacitors C1 and C2 serving as dividing (split) capacitors. The oscillating amplifier 2 is composed of, for example, a transistor 2A, and the crystal unit 3 is connected between base and collector terminals, the first capacitor C1 is connected between emitter and collector terminals, and the second capacitor C2 is connected between emitter and base terminals.

For example, with a base potential of the oscillating transistor 2A as a standard, the terminals of the oscillating resonant circuit 1 are connected between the base and collector terminals, and a midpoint (series-connected point) of the first and second capacitors C1 and C2 is connected to the emitter. Then, a voltage between the terminals of the oscillating resonant circuit 1 is set to an oscillation output Vout, and a part of the oscillation output Vout divided by the first and second capacitors C1 and C2 is fed back to the region between the base and emitter terminals to be an input Vi. Thereby, the oscillating transistor 2A amplifies a part (input Vi) of the oscillation output, and these operations are repeated to continue oscillation.

Normally, because its output impedance can be decreased to make coupling with the subsequent stage easy, a common collector is adopted (FIG. 6A). Reference numerals and letters R1 and R2 in the drawing denote base and bias resistances, reference numeral and letter R3 is a load resistance, and reference letter Vcc is a power supply. Note that even in this case, it is a matter of course that the circuit diagram is the same as the oscillator circuit diagram of FIG. 5A described above at a high frequency.

The crystal unit (crystal element) 3 is formed as an SC-cut crystal element which is typical as a so-called double rotation Y cut system in which the Y-axis is rotated twice around the X-axis and the Z-axis of the crystal axes (XYZ). In the SC-cut crystal unit 3, as shown in a reactance characteristics diagram of FIG. 7, C mode as thickness-shear vibration is principal vibration, and normally, secondary vibration in B mode whose displacement direction is perpendicular to the principal vibration is generated. As is clear from an equivalent circuit of crystal unit (not shown), these principal vibration (C mode) and secondary vibration (B mode) both have resonance points (resonant frequencies) f1 and f2 and antiresonance points (antiresonant frequencies) f1' and f2'.

In this case, the C mode and the B mode come close to each other, and the B mode comes to a higher frequency side by approximately 10% of the C mode, and its resonant level at the resonance point f2 is made the same or greater than that at the resonance point f1, which means that its crystal impedance (CI) is made the same or less than that in C mode. Then, in any case, the regions between the resonance points f1 and f2 and the antiresonance points f1' and f2' are considered as inductor regions $\Delta F1$ and $\Delta F2$, and the inductor region $\Delta F1$ in C mode and the first and second capacitors C1 and C2 form the oscillating resonant circuit 1.

Thereby, a resonant frequency is determined on the basis of inductance at the vibrational frequency f1$o$ in the inductor region $\Delta F1$ and a composite capacitance of the first and second capacitors C1 and C2, and the vibrational frequency f1$o$ in the inductor region $\Delta F1$ is an oscillating frequency. However, an oscillating frequency is determined on the basis of the inductance, the composite capacitance, and a serial equivalent capacitance in which all the capacitances at the circuit side including the oscillating transistor 2A when viewed from the crystal unit 3 are added, and the oscillating frequency approximately corresponds to an oscillating frequency fo.

Accordingly, the inductor region $\Delta F1$ (f1-f1') between the resonance point f1 and the antiresonance point f' in principal vibration (C mode) is a basic oscillation region in C mode. Then, this is the same as in secondary vibration (in B mode) as well, and the inductor region $\Delta F2$ in B mode is an oscillation region in which oscillation is possible. Note that, in practice, the oscillation regions in the respective modes are narrower than the inductor regions $\Delta F1$ and $\Delta F2$.

On the other hand, as described above, the B mode comes close to the C mode, and its resonant level is made the same or greater than that in C mode, which means that its CI is made the same or less than that in C mode. Accordingly, it is difficult to set a circuit constant or the like in a case of oscillation at only the vibrational frequency f1$o$ in the inductor region $\Delta F1$ in C mode that is principal vibration, which brings about oscillation in B mode (at the vibrational frequency f2$o$ in the inductor region $\Delta F2$).

For this reason, for example, in JP-A-2006-345115, as shown in FIG. 6B, a first LC series circuit 4$x$ composed of an inductor L and a capacitor C is connected between the midpoint of the first and second capacitors C1 and C2 and the emitter, and a second LC series circuit 4$y$ which is the same as the first LC series circuit 4$x$ is connected between the emitter and the ground (collector). Incidentally, even in this case, the circuit diagram is the same as the oscillator circuit diagram of FIG. 5B described above at a high frequency. A voltage applied to the first LC series circuit 4$x$ is approximately corresponded to the vibrational frequency (i.e., oscillating frequency) f1$o$ in the oscillation region $\Delta F1$ in C mode, and a voltage applied to the second LC series circuit 4$y$ is approximately corresponded to the vibrational frequency f2$o$ in the oscillation region $\Delta F2$ in B mode.

Thereby, the first LC series circuit 4x feeds back the oscillating frequency (vibrational frequency) f1o in C mode and frequency components in the vicinity thereof to the base via the midpoint of the first and second capacitors C1 and C2 from the emitter. Then, the first LC series circuit 4x suppresses the frequency domain (components) other than those, to form a sort of passband for C mode. Further, the second LC series circuit 4y forms a region for damping B mode so as to bring frequency components in the oscillation region ΔF2 in B mode from the emitter down to the ground potential to eliminate those from the feedback loop to the base. Accordingly, it is possible to damp oscillation in B mode, which makes certain of oscillation at the vibrational frequency f1o in C mode.

In this case, with respect to the negative resistance characteristics at the circuit side when viewed from the crystal unit 3, as shown in FIG. 8, given that a resistance value is 0 at a frequency fα between the oscillation region ΔF1 in principal vibration (C mode) and the oscillation region ΔF2 in secondary vibration (B mode), the characteristics become negative resistance in the oscillation region ΔF1 in C mode, and become positive resistance in the oscillation region ΔF2 in B mode. Accordingly, the oscillator circuit satisfies its electricity condition that is one of the oscillation conditions, to generate oscillation in C mode. However, the oscillator circuit does not satisfy the electricity condition in B mode, and does not generate oscillation.

Incidentally, JP-A-2000-295037 and JP-A-9-153740 also disclose related art crystal oscillator circuits.

However, in the related crystal oscillator circuits (B mode damping) having the above-described configurations, because the first and second series resonant circuits 4 (x and y) forming a passband for C mode that is principal vibration and a region for damping B mode that is secondary vibration are inserted into the feedback loop, there is a problem that the number of components is increased. Further, in the case of JP-A-2000-295037 as well, a passband for C mode and a region for damping B mode are formed for the same purpose. However, in this case as well, there is the problem that a number of components is increased in the same way.

SUMMARY OF THE INVENTION

An object of the invention is to particularly provide a crystal oscillator circuit whose crystal unit is formed as an SC-cut crystal element, the crystal oscillator circuit in which oscillation at a vibrational frequency in secondary vibration mode is damped, which makes certain of oscillation at a vibrational frequency in principal vibration mode, and the number of components is decreased.

The invention is achieved by focusing attention on the point that an oscillating resonant circuit formed as a Colpitts type oscillator circuit have first and second capacitors serving as dividing capacitors, which are essential requirements, and the point that it suffices for the first and second capacitors to function as capacitance components (capacitors) in only oscillation regions. Then, for example, one of the capacitors serves as a capacitance component in an oscillation region as a frequency dependent reactance element (reactance circuit), and serves as a resistance component out of the oscillation region. Thereby, conceiving of an idea that a Colpitts type oscillator circuit is formed in an oscillation region and a Colpitts type oscillator circuit is not formed out of the oscillation region.

According to a first aspect of the invention, there is provided a secondary vibration damping type crystal oscillator circuit comprising: an oscillating resonant circuit including a crystal unit functioning as an inductor component, and first and second capacitors; and an oscillating transistor that feedback-amplifies an oscillating frequency by the oscillating resonant circuit, wherein the secondary vibration damping type crystal oscillator circuit is formed as a Colpitts type oscillator circuit, in which the crystal unit is connected between base and collector terminals, the first capacitor is connected between emitter and collector terminals, and the second capacitor is connected between emitter and base terminals of the oscillating transistor, wherein the secondary vibration damping type crystal oscillator circuit is configured to set a vibrational frequency in principal vibration mode of the crystal unit as an oscillating frequency, and to damp oscillation at a vibrational frequency in secondary vibration mode that is close to the principal vibration mode, wherein a region between the emitter and collector terminals or a region between the emitter and base terminals of the oscillating transistor includes a reactance parallel circuit, in which an LC series circuit including an inductor and a capacitor is connected in parallel to the first or second capacitor, wherein the reactance parallel circuit has resonant characteristics such that the reactance parallel circuit is made capacitive at an oscillating frequency in the principal vibration mode, and a resonant frequency of the LC series circuit corresponds to the vibrational frequency in the secondary vibration mode.

According to a second aspect of the invention, in the secondary vibration damping type crystal oscillator circuit, wherein the resonant frequency of the LC series circuit is higher than a resonant frequency of the reactance parallel circuit.

According to a third aspect of the invention, in the secondary vibration damping type crystal oscillator circuit, wherein the crystal unit is formed as an SC-cut crystal element, wherein the principal vibration mode is C mode and the secondary vibration mode is B mode, and wherein the B mode comes close to a higher frequency side from the C mode to generate oscillation.

According to the aspects of the invention, the reactance parallel circuit composed of the first capacitor and the LC series circuit is provided, for example, between the emitter and collector terminals of the oscillating transistor, and the region between the emitter and base terminals serves as the second capacitor. In this case, the oscillating resonant circuit is composed of the crystal unit serving as an inductor component, the reactance parallel circuit, and the second capacitor.

In this case, since the reactance parallel circuit serves as a capacitance component at the oscillating frequency (the vibrational frequency of the crystal unit in oscillating) in principal vibration mode, the reactance parallel circuit forms dividing capacitors along with the second capacitor. Accordingly, both regions between the emitter and collector terminals and between the emitter and base terminals serve as capacitors (capacitances) to form a Colpitts type oscillating resonant circuit. Thereby, it is possible to generate oscillation at a vibrational frequency serving as an inductor component in principal vibration mode of the crystal unit.

In contrast thereto, the resonant frequency of the LC series circuit connected in parallel to the first capacitor of the reactance parallel circuit (between the emitter and collector terminals) corresponds to the vibrational frequency in secondary vibration mode. Accordingly, at the vibrational frequency in secondary vibration mode, the series resonant circuit serves as only a resistance component dramatically less than the impedance of the first capacitor C1.

In this case, the reactance parallel circuit as well basically becomes a resistance component. Accordingly, the reactance parallel circuit serving as a resistance component does not satisfy the requirements (principles) for a Colpitts type oscillator circuit in which both regions between the emitter and collector terminals and between the emitter and base terminals serve as capacitors. Thereby, oscillation at the vibrational frequency in secondary vibration mode is basically not generated. In detail, at the vibrational frequency in secondary vibration, the resistance at the circuit side when viewed from the crystal unit becomes positive resistance, and negative resistance is not provided. Further, the phase condition in which positive feedback is performed at the input and output of the oscillating transistor as well is not satisfied.

In accordance therewith, in the invention, oscillation in secondary vibration mode is damped, which makes certain of oscillation in principal vibration mode. Then, because the reactance parallel circuit is configured such that the LC series circuit is merely connected to the first capacitor, it is possible to decrease circuit elements for forming a secondary vibration damping type crystal oscillator circuit. Note that this is the same as in a case in which the region between the emitter and collector terminals serves as a first capacitor and the region between the emitter and base terminals serves as a reactance parallel circuit.

Incidentally, according to the second aspect of the invention, the configuration such that "the reactance parallel circuit has resonant characteristics such that the reactance parallel circuit is made capacitive at an oscillating frequency in the principal vibration mode, and a resonant frequency of the LC series circuit corresponds to the vibrational frequency in the secondary vibration mode" in the first aspect, can be made more apparent.

Further, according to the third aspect of the invention, the principal vibration mode and the secondary vibration mode in the first aspect can be made apparent, which makes certain of oscillation in C mode that is principal vibration in which B mode that is secondary vibration in an SC-cut crystal element is damped.

DETAILED DESCRIPTION OF THE PREFERRED EMBODIMENTS

Figure 1:
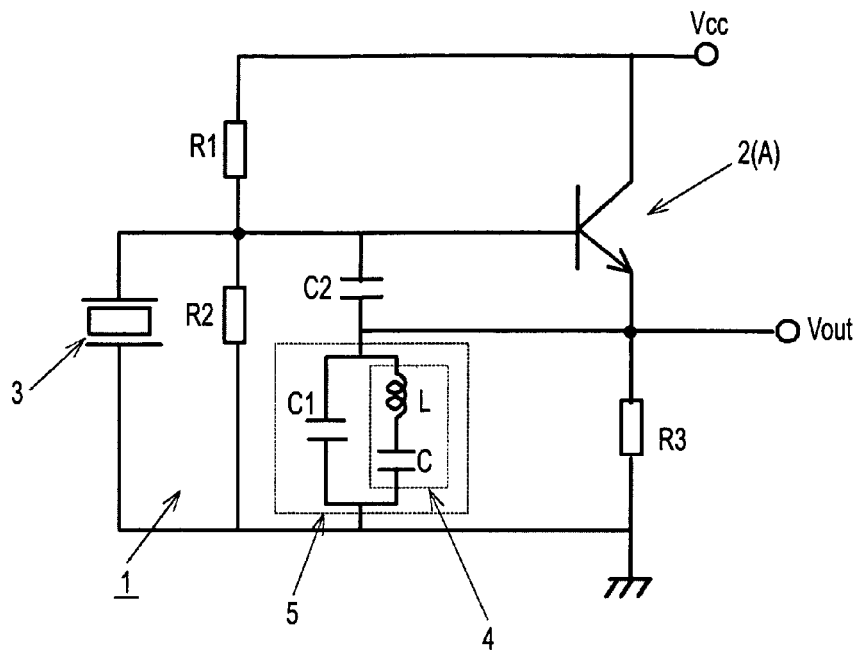
FIG. 1 is a diagram for explanation of a crystal oscillator circuit according to one embodiment of the invention.

FIG. 1 is a diagram for explanation for explanation of a crystal oscillator circuit according to one embodiment of the invention. Incidentally, portions which are the same as those in the related art are denoted by the same numbers, and descriptions thereof will be simplified or omitted.

Figure 7:
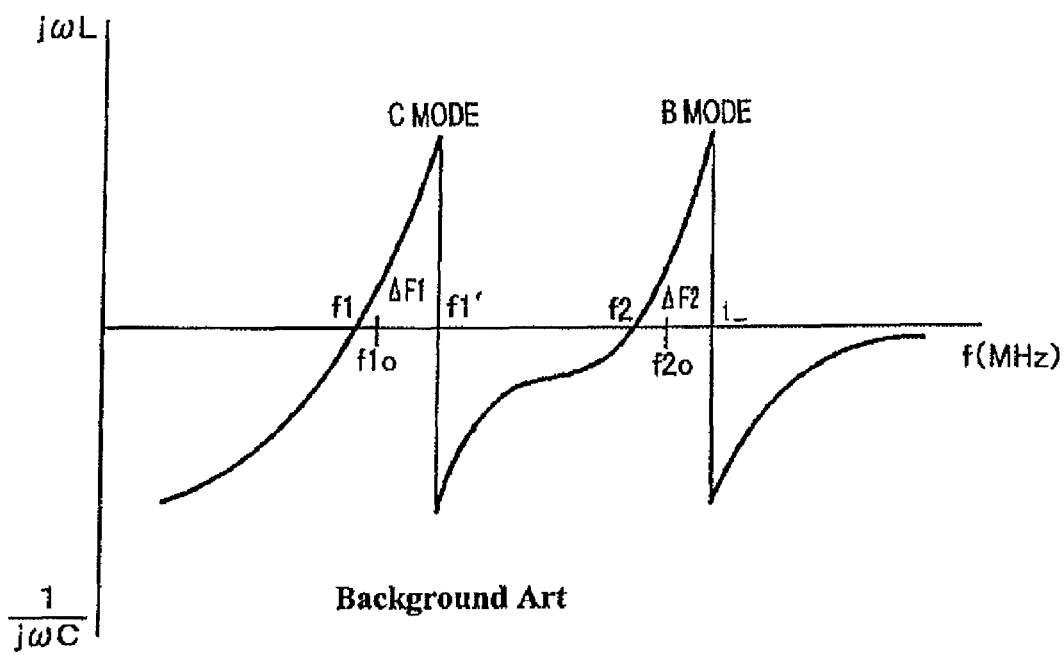
FIG. 7 is a reactance characteristics diagram of a crystal unit (an SC-cut crystal element) in the related art crystal oscillator circuit.
Figure 8:
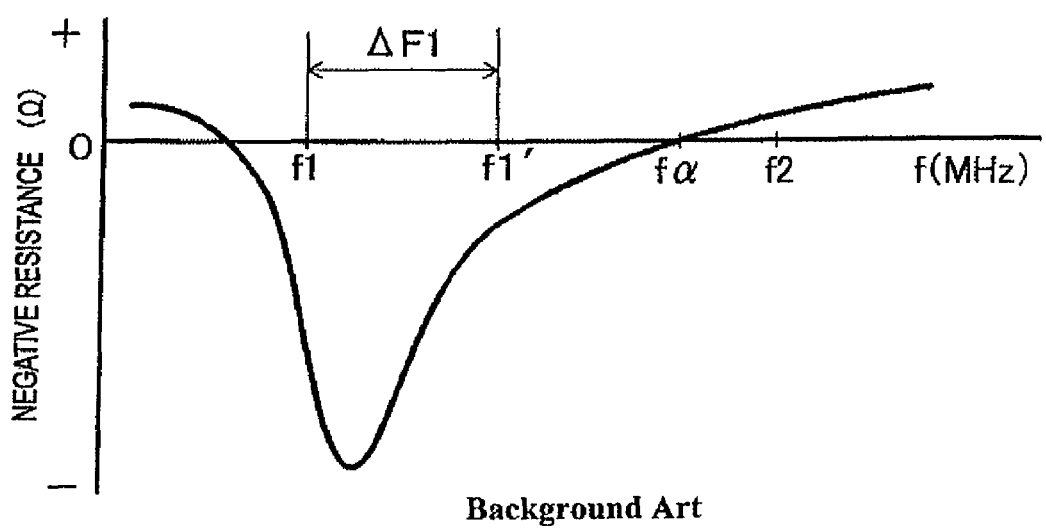
FIG. 8 shows a negative resistance characteristics of the related art crystal oscillator circuit as viewed from the crystal unit.

The crystal oscillator circuit according to the invention is, as described above, formed as a Colpitts type oscillator circuit, and configured to have a general common collector. Then, the crystal unit 3 serving as an inductor component is connected between the base and collector terminals, the first capacitor C1 is connected between the emitter and collector terminals, and the second capacitor C2 is connected between the emitter and base terminals of an oscillating transistor 2A. The crystal unit 3 is formed as an SC-cut crystal element, and secondary vibration in B mode in which a CI is the same or less than that in C mode comes close to a higher frequency side of C mode that is principal vibration (refer to FIG. 7).

Then, in this example, an LC series circuit 4 composed of an inductor L and a capacitor C is connected in parallel to the first capacitor C1 between the emitter and collector terminals of the oscillating transistor 2A. To describe in short, a reactance parallel circuit 5 composed of the first capacitor C1 and the LC series circuit 4 is connected between the emitter and collector terminals. However, this is the same even in a case in which the positions of the first capacitor C1 and the capacitor C are switched.

Figure 2:
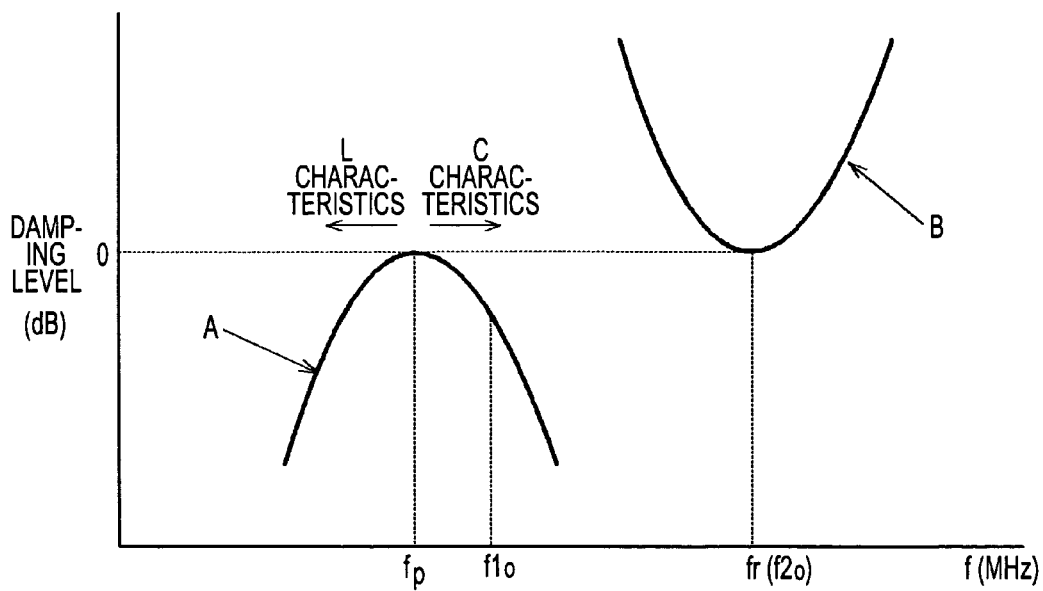
FIG. 2 is a resonant characteristics diagram for explanation of an action of the embodiment of the invention.

Then, a resonant frequency fp of the reactance parallel circuit 5 is, as shown in FIG. 2 (curved line A), at a lower frequency side from a vibrational frequency f1$o$ (i.e., the oscillating frequency f1$o$) in oscillating in C mode (principal vibration), and the reactance parallel circuit 5 has resonant characteristics in which the circuit becomes a capacitance component (C characteristics) at the oscillating frequency f1$o$. Note that, the reactance parallel circuit 5 becomes an inductor component (L characteristics) at a frequency lower than the resonant frequency fp. In contrast thereto, a resonant frequency fr of the LC series circuit 4 is set to a frequency higher than the resonant frequency fp of the reactance parallel circuit 5, to become a vibrational frequency f2$o$ in the inductor region ΔF2 in B mode that is secondary vibration (curved line B in FIG. 2).

According to such a configuration, the reactance parallel circuit 5 between the emitter and collector terminals of the oscillating transistor 2A is to be a capacitance component at the oscillating frequency f1$o$ (and in its region) in C mode. Accordingly, the reactance parallel circuit 5 satisfies circuit conditions (principles) for a Colpitts type oscillator circuit in which both regions between the emitter and collector terminals and between the emitter and base terminals serve as capacitances along with the second capacitor C2. In this case, in the detail, the the resistance component at the circuit side when viewed from the crystal unit 3 becomes negative resistance to satisfy the electricity condition, and both are made capacitive to satisfy its phase condition. Accordingly, oscillation in C mode that is principal vibration is made possible.

In contrast thereto, because the LC series circuit 4 in the reactance parallel circuit 5 between the emitter and collector terminals is set such that its resonant frequency fr is the vibrational frequency f2$o$ in B mode, the LC series circuit 4 becomes a resistance component in the frequency region (inductor region ΔF2) including the resonant frequency fr. Accordingly, because the region between the emitter and collector terminals becomes a resistance component, the circuit conditions for a Colpitts type oscillator circuit in which both regions between the emitter and collector terminals and between the emitter and base terminals serve as capacitances are not satisfied. That is, because the electricity condition and the phase condition described above are not satisfied, oscillation is not generated at the vibrational frequency f2o in the inductor region ΔF2 in B mode (secondary vibration).

In these cases, as a supplementary description, the reactance parallel circuit 5 between the emitter and collector terminals of the oscillating transistor 2A has parallel resonant characteristics (however, which is capacitive at the oscillating frequency f1o) in the oscillation region in C mode as described above. That is, a voltage between the terminals of the reactance parallel circuit 5 is maximized at the resonant frequency fp. However, because the reactance parallel circuit 5 is composed of the LC elements, Q is small, and its resonant characteristics are broad.

Accordingly, impedance between the midpoint of the reactance parallel circuit 5 and the second capacitor C2 and the ground potential as a common collector (the collector has zero potential at a high frequency) is increased. Then, because the impedance between the series-connected point and the emitter becomes smaller relatively, a feedback current to the base via the series-connected point from the emitter is increased. Thereby, negative resistance in the oscillation region in C mode is increased, which makes it easy to generate oscillation in principal vibration (C mode).

In contrast thereto, the LC series circuit 4 of the reactance parallel circuit 5 has serial resonant characteristics in which the vibrational frequency f2o in B mode is set as a resonant frequency. That is, impedance between the terminals of the LC series circuit 4 is minimized. Accordingly, because the vibrational frequency f2o in B mode and frequency components in that region flow into the ground potential as a common collector, a feedback current to the base via the midpoint from the emitter is decreased. Thereby, negative resistance in the oscillation region in B mode is decreased, which damps oscillation in secondary vibration (B mode).

As described above, oscillation in B mode that is secondary vibration is damped, which makes certain of oscillation in C mode that is principal vibration. Then, because it suffices to merely connect in parallel the LC series circuit 4 to one of the first and second capacitors C1 and C2, it is possible to decrease the number of components.

(Other Aspects)

Figure 3A:
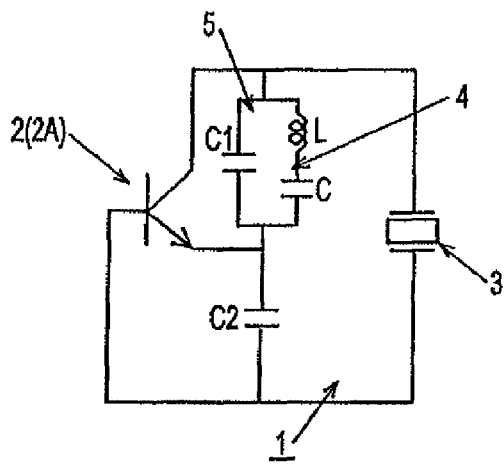
FIGS. 3A and 3B are diagrams for explanation of crystal oscillator circuits according to other examples of the invention, both of which are diagrams of high-frequency type equivalent circuits.
Figure 3B:
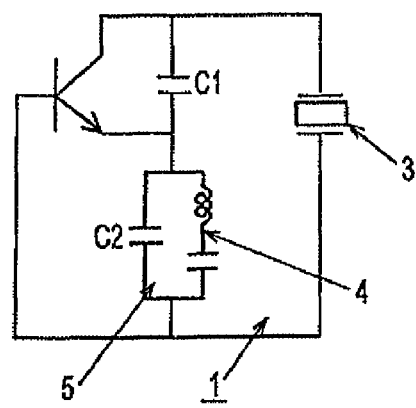

The above-described embodiment has been described by showing a concrete example in which the oscillator circuit is configured to have a common collector. However, the equivalent circuit at a high frequency in this case is as shown in FIG. 3A, and the invention may be basically applied regardless of a grounding system. Then, the reactance parallel circuit 5 performs the same advantageous effects, not only between the emitter and collector terminals, but also between the emitter and base terminals as shown in FIG. 3B. In the equivalent circuits of FIGS. 3A, 3B the power supplies, bias resistances, and the like are eliminated.

Figure 4:
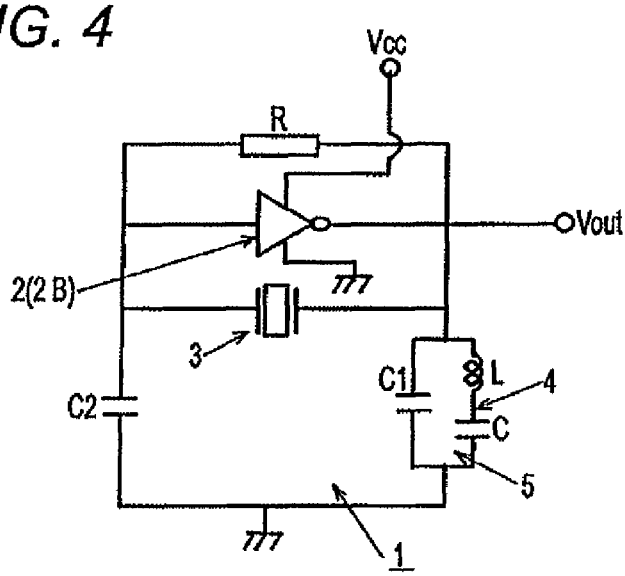
FIG. 4 is a diagram for explanation of another application example of the crystal oscillator circuit according to the invention.
Figure 5A:
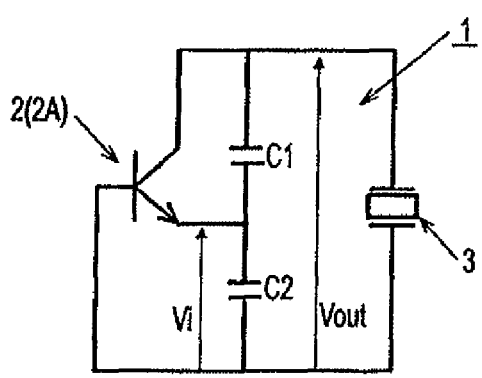
FIGS. 5A and 5B are diagrams for explanation of related art crystal oscillator circuits, both of which are diagrams of equivalent circuits at a high frequency.
Figure 5B:
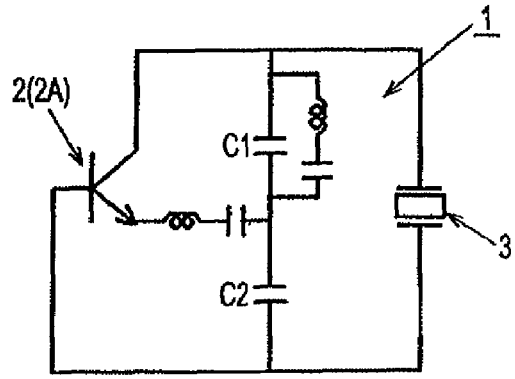
Figure 6A:
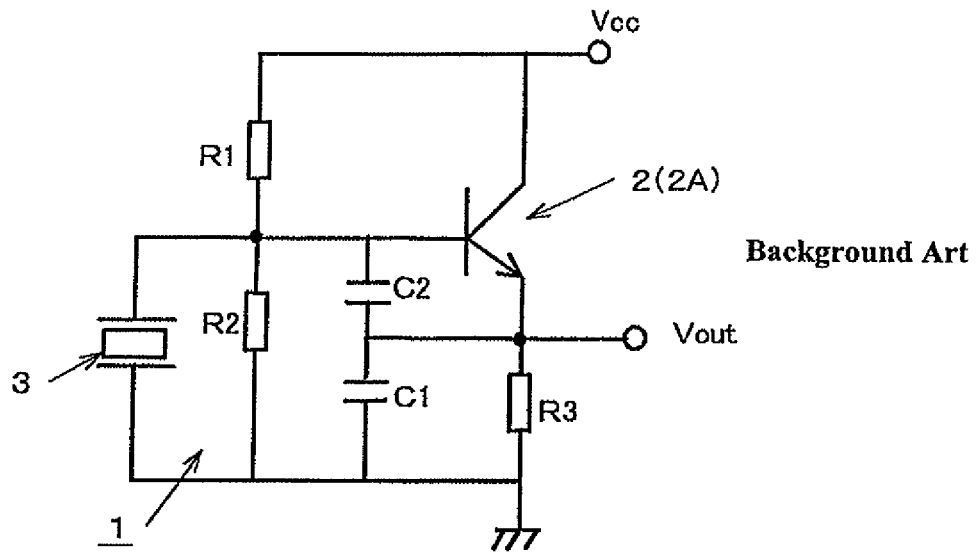
FIGS. 6A and 6B are diagrams for explanation of the related art crystal oscillator circuits, both of which are diagrams of crystal oscillator circuits which are configured to have common collectors.
Figure 6B:
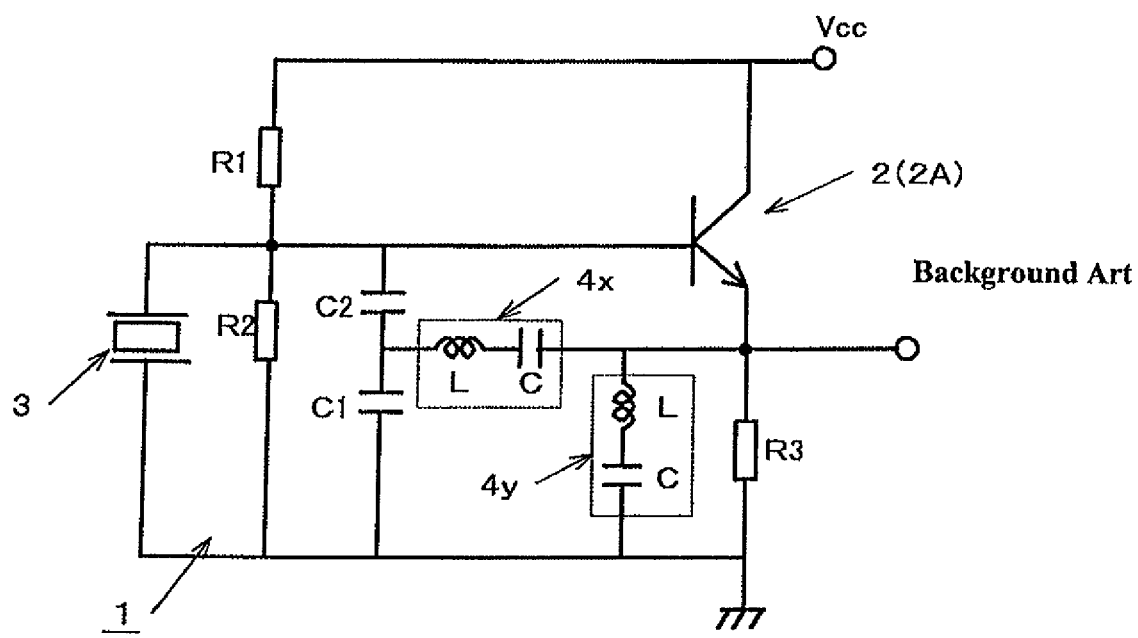

Further, the oscillating amplifier is the transistor 2A in the above description. However, as shown in FIG. 4, for example, the invention may be applied in the same way even in a case in which a CMOS inverter 2B is used as the oscillating amplifier 2. In this case, because the common connection point of the CMOS inverter is grounded, it is basically the same as a common emitter of the oscillating transistor 2A. That is, the invention may be applied to a case in which the oscillating resonant circuit 1 is composed of the crystal unit 3 serving as an inductor component and the first and second capacitors C1 and C2 to form a Colpitts type crystal oscillator circuit.

Then, the crystal unit 3 is not limited to an SC-cut crystal element, and particularly it is a matter of course that the invention may be applied to, for example, a case in which oscillation in contour type secondary vibration mode is generated at a higher frequency side from the oscillating frequency f1o. Moreover, the invention may be applied even to a case in which an inductor, which is not shown, is connected in series to the crystal unit 3 to broaden the inductor region F1 (in other words, the oscillation region). In this case, the crystal unit including the inductor is formed as a crystal unit in a scope of the invention. That is, the invention may be applied to a case in which a region between the collector and base terminals serves as an inductor component by using a crystal unit, to form a Colpitts type oscillator circuit.

What is claimed is:

1. A secondary vibration damping type crystal oscillator circuit comprising:
    an oscillating resonant circuit including a crystal unit functioning as an inductor component, and first and second capacitors; and
    an oscillating transistor that feedback-amplifies an oscillating frequency by the oscillating resonant circuit,
    wherein the secondary vibration damping type crystal oscillator circuit is formed as a Colpitts type oscillator circuit, in which the crystal unit is connected between base and collector terminals, the first capacitor is connected between emitter and collector terminals, and the second capacitor is connected between emitter and base terminals of the oscillating transistor,
    wherein the secondary vibration damping type crystal oscillator circuit is configured to set a vibrational frequency in principal vibration mode of the crystal unit as an oscillating frequency, and to damp oscillation at a vibrational frequency in secondary vibration mode that is close to the principal vibration mode,
    wherein a region between the emitter and collector terminals or a region between the emitter and base terminals of the oscillating transistor includes a reactance parallel circuit, in which an LC series circuit including an inductor and a capacitor is connected in parallel to the first or second capacitor,
    wherein the reactance parallel circuit has resonant characteristics such that the reactance parallel circuit is made capacitive at an oscillating frequency in the principal vibration mode, and a resonant frequency of the LC series circuit corresponds to the vibrational frequency in the secondary vibration mode.

2. The secondary vibration damping type crystal oscillator circuit according to claim 1,
    wherein the resonant frequency of the LC series circuit is higher than a resonant frequency of the reactance parallel circuit.

3. The secondary vibration damping type crystal oscillator circuit according to claim 1,
    wherein the crystal unit is formed as an SC-cut crystal element,
    wherein the principal vibration mode is C mode and the secondary vibration mode is B mode, and
    wherein the B mode comes close to a higher frequency side from the C mode to generate oscillation.

4. The secondary vibration damping type crystal oscillator circuit according to claim 1, wherein the reactance parallel circuit includes an LC series circuit which is directly connected in parallel to the first or second capacitor.

5. The secondary vibration damping type crystal oscillator circuit according to claim 1, the reactance parallel circuit consists of a single LC series circuit connected in parallel to the first or second capacitor.

6. The secondary vibration damping type crystal oscillator circuit according to claim 1, the resonant frequency of the LC series circuit corresponding to the vibrational frequency in the secondary vibration mode causes the reactance parallel circuit to become a substantially resistance component.

* * * * *